United States Patent [19]

Kumar et al.

[11] Patent Number: 4,564,816
[45] Date of Patent: Jan. 14, 1986

[54] PREDISTORTION CIRCUIT

[75] Inventors: Mahesh Kumar, Dayton; James C. Whartenby, Trenton, both of N.J.

[73] Assignee: RCA Corporation, Princeton, N.J.

[21] Appl. No.: 608,415

[22] Filed: May 9, 1984

[51] Int. Cl.[4] .............................................. H03F 1/32
[52] U.S. Cl. .................................... 330/149; 330/277; 330/295; 328/163
[58] Field of Search ................... 330/149, 277, 124 R, 330/295; 328/163; 455/50, 63; 332/18, 37 R

[56] References Cited

U.S. PATENT DOCUMENTS

| 3,675,138 | 7/1972 | Standing | 328/163 |
| 3,755,754 | 8/1973 | Putz | 330/149 |
| 4,109,212 | 8/1973 | Donnell et al. | 328/163 |
| 4,283,684 | 8/1981 | Satoh | 330/149 X |
| 4,462,001 | 7/1984 | Girard | 330/149 |
| 4,465,980 | 8/1984 | Huang et al. | 330/277 X |

Primary Examiner—James B. Mullins
Attorney, Agent, or Firm—Joseph S. Tripoli; Robert L. Troike; Raymond E. Smiley

[57] ABSTRACT

A predistortion circuit for use with a solid state power amplifier or traveling wave tube amplifier which exhibits phase and amplitude nonlinearities. The predistortion circuit, which produces gain and phase distortion complementary to that of the associated power amplifier, comprises a hybrid circuit for splitting the input signal into two output signals at respective output terminals, the signals having a relative phase difference of 90°, a pair of dual gate FETs or other active nonlinear devices each connected to a different one of the two output terminals and a combiner for combining in-phase the outputs of the nonlinear devices. Bias on the nonlinear devices is adjusted to effect, in the predistortion circuit, nonlinearities complementary to those of the power amplifier.

11 Claims, 9 Drawing Figures

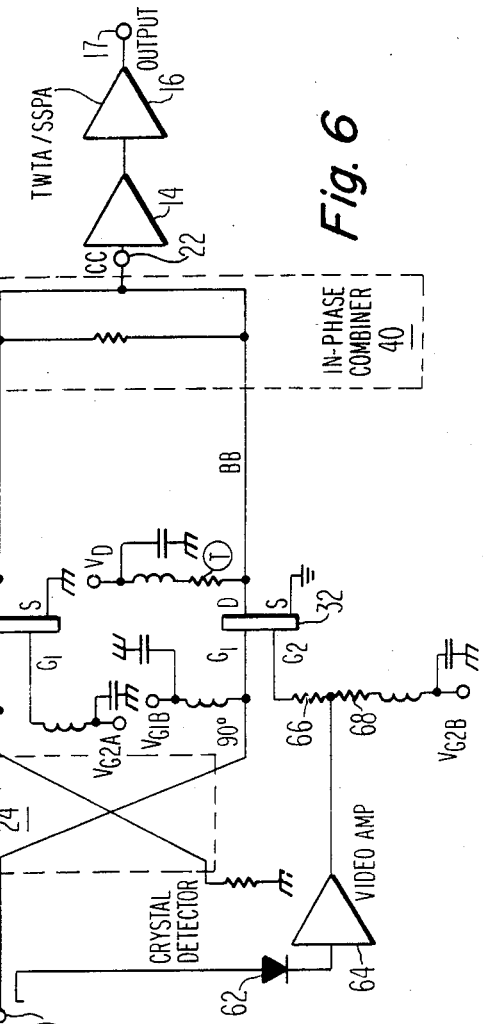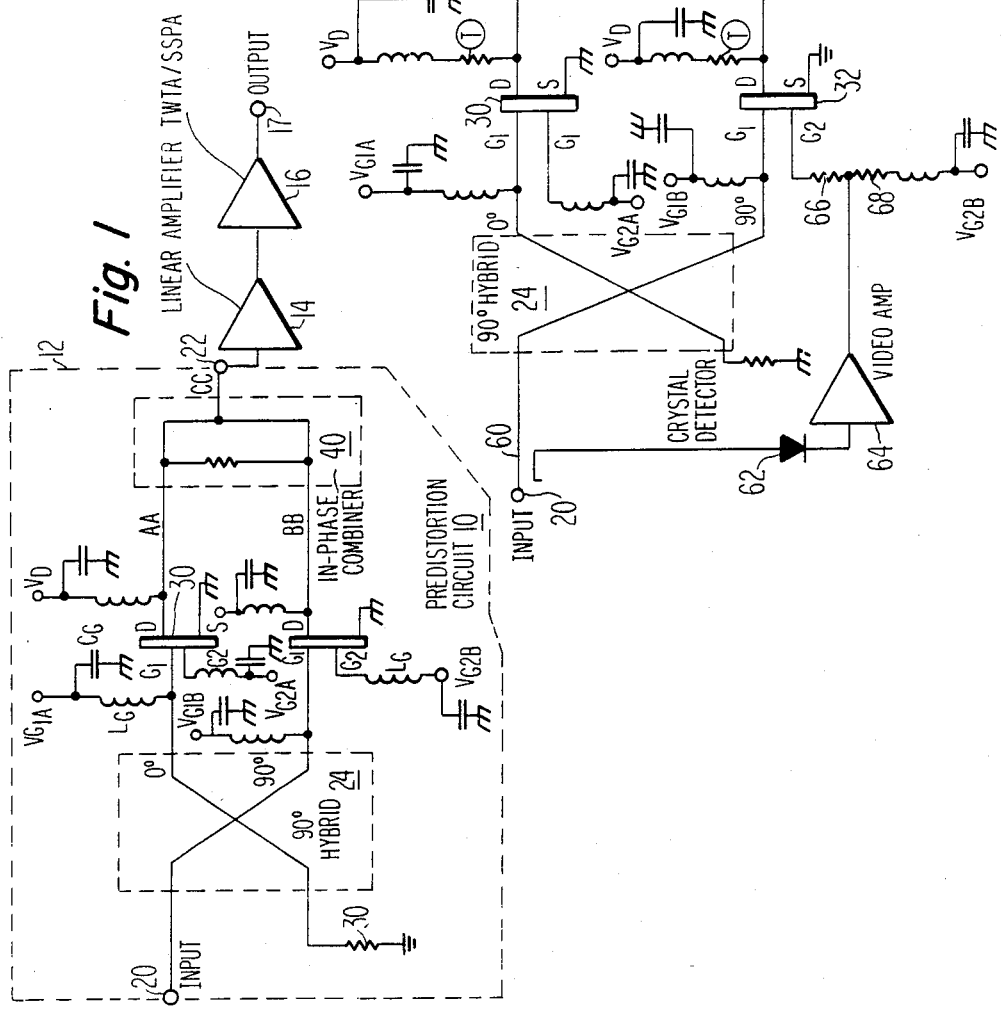

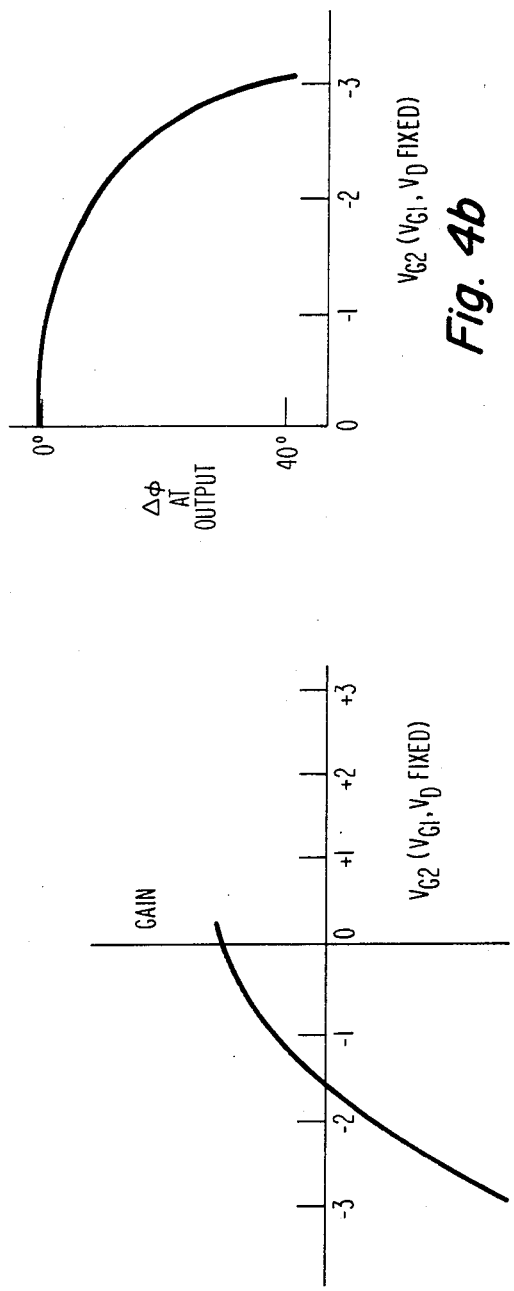
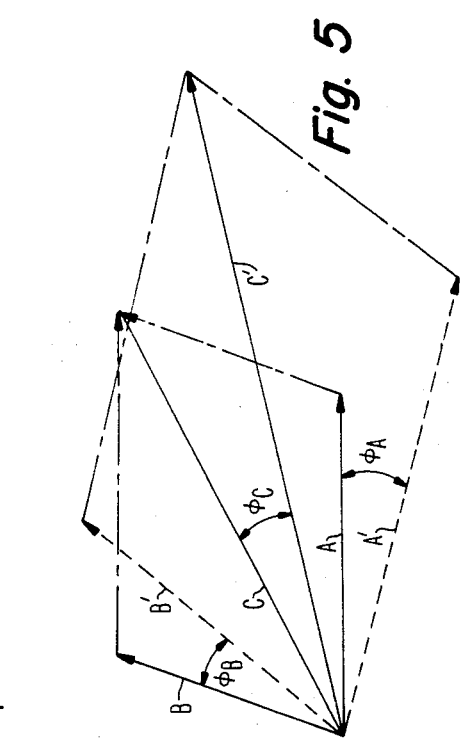

PREDISTORTION CIRCUIT

This invention is concerned with predistortion circuits used for linearizing power amplifiers, and more particularly, to such circuits which operate at microwave frequencies.

BACKGROUND OF INVENTION

Microwave power amplifiers of the traveling wave tube type or solid state type used in ground station transmitters and communication satellites should ideally be highly efficient and provide linear amplification. The performance of these amplifiers is undesirably limited by nonlinearities. In order to reduce amplitude and phase distortions of the signals generated in the microwave power amplifiers and obtain higher carrier to intermodulation distortion products (C/I) ratios, amplifiers are conventionally operated well below saturation with consequent loss of efficiency.

In traveling wave tube amplifiers (TWTA) or solid state power amplifiers (SSPA), for example, there are two sources of nonlinearities: (a) amplitude nonlinearity and (b) phase nonlinearity. The intermodulation distortion (IMD) generated by phase nonlinearity is orthogonal to IMD generated by amplitude nonlinearity. Predistortion is one of the best ways of the many methods of nonlinear compensation. In this technique, the inverse amplitude and phase nonlinearities are added to the TWTA/SSPA input signal to cancel the TWTA/SSPA output nonlinearities. A predistortion circuit should be capable of generating both inverse amplitudes and phase nonlinearities to achieve a substantial reduction in the IMD products. Most of the prior art distortion circuits have used either diodes or MESFETs as the nonlinear elements along with associated complex circuits, such as phase shifters, attenuators, etc.

SUMMARY OF THE INVENTION

In accordance with a preferred embodiment of the present invention, a predistortion circuit for a power amplifier which exhibits phase and amplitude nonlinearities as a function of input power comprises in combination: an input terminal coupled to receive a signal to be amplified and an output terminal coupled to the input of said power amplifier, means for power dividing a signal applied to the circuit input terminal and for providing a 90° phase shift of one divided signal relative to the other, first and second active nonlinear means, each adapted for receiving an input signal from a different one of the power divider outputs and each adapted for producing an output signal, and means coupled to receive the output signals from the nonlinear means for combining in phase the signal produced by the active nonlinear means. The active nonlinear means are each adapted for controlling the amount of distortion produced by the predistortion circuit whereby the predistortion circuit predistorts the signal in a manner complementary to the distortion produced by the following power amplifier.

BRIEF DESCRIPTION OF THE DRAWING

FIG. 1 is a predistortion circuit in electrical schematic form in accordance with a preferred embodiment of the present invention and a following amplifier circuit having distortion which is to be compensated;

FIGS. 4a and 4b respectively show changes in gain and phase of a dual gate field effect transistor as a function of control gate bias signal level;

FIG. 5 is a vector diagram useful in understanding the operation of the FIG. 1 predistortion circuit; and FIG. 6 is a second predistortion circuit in electrical schematic form in accordance with an additional preferred embodiment of the present invention.

DETAILED DESCRIPTION OF THE INVENTION

Figure 2B:
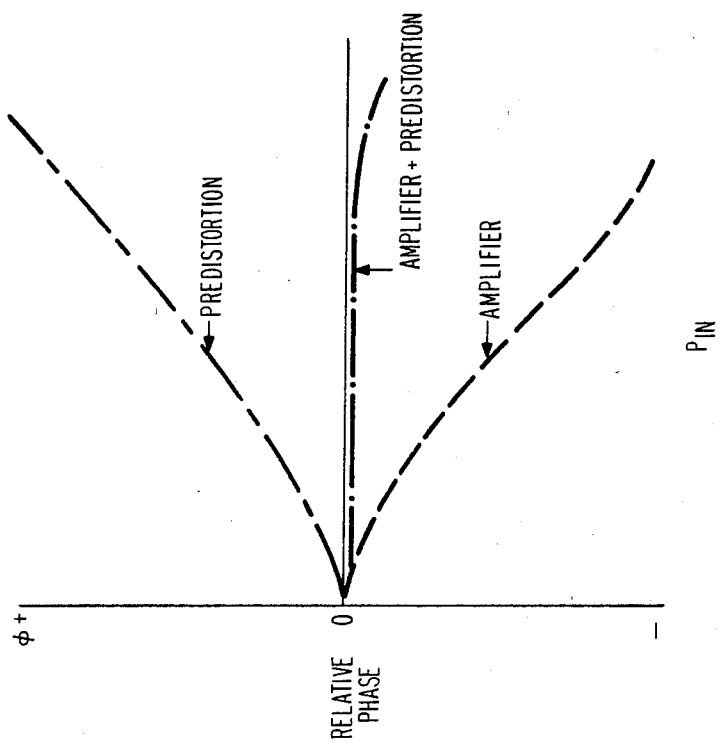
FIGS. 2a and 2b are sets of plots illustrating amplitude and phase distortion of the FIG. 1 predistortion circuit and the following amplifier circuit.

Referring now to FIG. 1 a predistortion circuit 10 within dashed block 12 in accordance with a preferred embodiment of the present invention is series connected with a linear amplifier 14 and a traveling wave tube amplifier (TWTA) or solid state power amplifier (SSPA) 16 connected to system output terminal 17. The amplifiers are of conventional design.

The linearizer connected between input terminal 20 and output terminal 22 includes a means for dividing the signal input at terminal 20 into two equal power output signals having a phase difference of 90°, a 90° hybrid 24 being shown by way of example. With an exemplary 90° hybrid the power levels at two outputs indicated by 0° and 90° of phase shift, respectively, are each at the same power level but unequal power division is also acceptable. The fourth port of the 90° hybrid 24 is resistively coupled to ground by match terminating resistor 30. The 0° and 90° phase shifted outputs of hybrid 24 are connected respectively to signal gates $G_1$ of a first dual gate FET 30 and a second dual gate 32, respectively.

As will be described more fully hereinafter the purpose of dual gate FETs 30 and 32 is to provide nonlinear phase and gain in the output signal relative to input signal as a function of input signal level. Other nonlinear active devices with appropriate circuitry could be substituted for FETs 30 and 32 but particularly good control may be had over the nature of the nonlinearity by the use of such dual gate FETs.

Gate $G_1$ of each FET is coupled by a bias network, comprising an inductor $L_G$ and capacitor $C_G$ to a source of adjustable bias potential $V_{G1}$ ($V_{G1A}$ for transistor 30 and $V_{G1B}$ for transistor 32. Similarly, the control gate $G_2$ of each of transistors 30 and 32 is coupled through a similar biasing network to an adjustable source of potential $V_{G2}$ ($V_{G2A}$ for transistor 30 and $V_{G2B}$ for transistor 32). The drain of each of transistors 30 and 32 is inductively coupled to a souce of drain potential $V_D$ and is coupled via lines labeled AA and BB, respectively, to inputs of an in-phase power combiner 40. The in-phase combiner 40 may be of any conventional design and has its output at line CC connected to predistortion circuit 10 output terminal 22.

The predistortion circuit 10 introduces attenuation into the signal provided at input terminal 20. This attenuation is compensated for by linear amplifier 14. Therefore, ideally the signal produced at the output of linear amplifier 14 is of substantially the same magnitude as the signal input at terminal 20 but with purposely added amplitude and phase distortion which are opposite to the amplitude and phase distortion caused by amplifier 16 such that there is ideally no gain or phase distortion through the combination of predistortion circuit 10 and amplifier 16. Operation of the circuit of FIG. 1 will be best understood by reference first to FIGS. 2a, 2b, 3a, 3b, 4a, 4b and 5 to which attention is now directed.

Figure 2A:
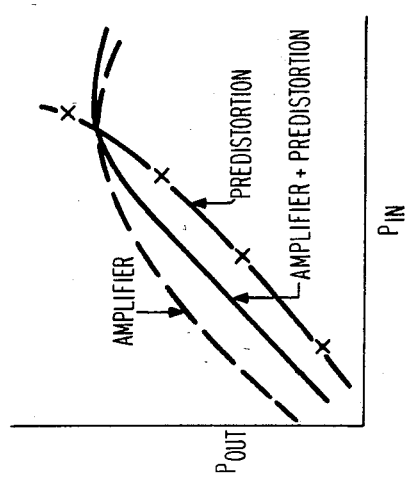

FIG. 2a illustrates three plots sharing common horizontal and vertical coordinate axes of input power and output power. The plot legended "amplifier" illustrates input power at terminal 22 versus output power at terminal 17 of a typical SSPA or TWTA such as 16 FIG. 1. It should be noted that the plot is that of a nonlinear amplifier since the plot is not a straight line which is what is desired. The plot legended "predistortion" correlates input signal at terminal 20 with output signal at terminal 22 and is also nonlinear by design in the opposite sense from the nonlinearity present in amplifier 16. The third plot legended "amplifier plus predistortion" correlates system input power at terminal 20 to output power at terminal 17 and is essentially linear up to nearly the saturation point of the power amplifier 16, (the crossover point of the three waveforms).

Similarly, FIG. 2b illustrates three plots sharing common horizontal and vertical coordinate axes. The plot legended "amplifier" illustrates input of power versus relative phase change of the signal through amplifier 16, that is, a negatively changing phase with increased input power levels. The plot legended "predistortion" shows phase change of the signal through predistortion circuit 10 from input terminal 20 to output terminal 22 thereof and is directed (in a manner to be described) in the opposite sense from that of amplifier 16. That is, the predistortion circuit causes positive phase change of the signal with increase in input signal amplitude. Finally, the combined plot, that labeled "amplifier plus predistortion", is desirably a straight line illustrating zero phase at all levels of interest of input power.

The amplifier nonlinearities of phase and power cause very undesirable IMD products to be present at the higher levels of input power. Because the IMD products cause problems with different frequencies operating on a particular amplifier, it is common to operate the amplifier at substantially reduced levels from its maximum amplification potential.

Figure 3A:
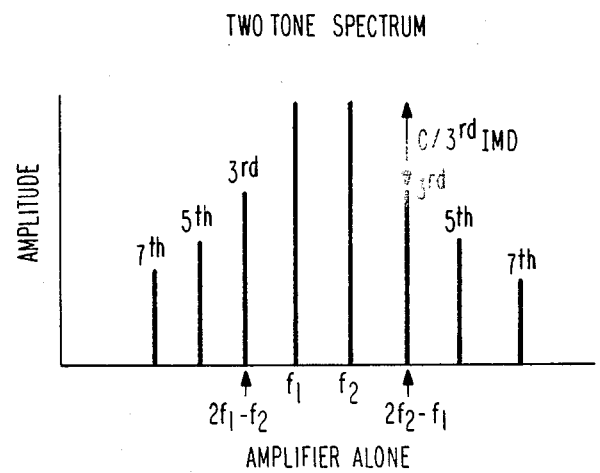
FIGS. 3a and 3b are sets of frequency diagrams illustrating intermodulation distortion respectively in a power amplifier alone and the combination of a power amplifier and predistortion circuit in accordance with a preferred embodiment of the invention.

FIG. 3a illustrates the problem of intermodulation distortion in a nonlinear amplifier. Frequencies f1 and f2 are assumed to be applied at the amplifier input terminal 22. FIG. 3a illustrates amplitude on the Y axis and frequency along the X axis. The amplitude of the third, fifth and seventh IMD products are as illustrated. In particular, the third IMD products are at frequencies $2f_1 - f_2$ and $2f_2 - f_1$. The difference in amplitude between the fundamental frequencies and third harmonics is C/3rd IMD which represents carrier to intermodulation distortion.

Figure 3B:
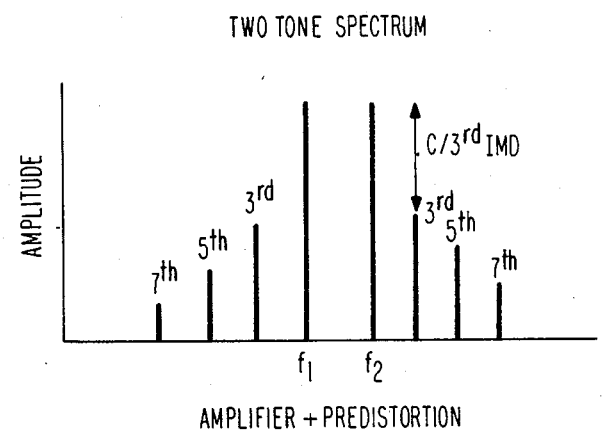

By comparison FIG. 3b illustrates the same two input signals f1 and f2 but now passing through both the predistortion circuit and power amplifier. It will be noticed that in contrast to FIG. 3a, the third and also the fifth and seventh IMD products are substantially lower in value relative to the fundamental signals f1 and f2. That is the ratio C/3rd IMD is much greater in FIG. 3b relative to FIG. 3a.

FIG. 4a is a plot illustrating the gain of a dual gate FET such as FETS 30 and 32 as a function of bias applied to control gate $G_2$ for a fixed value of gate 1 bias ($V_{G1}$) and drain bias ($V_D$). Thus, by adjusting $V_{G2A}$ and $V_{G2B}$ the gain of FETs 30 and 32, respectively, are set.

FIG. 4b is a plot illustrating the change in phase of a signal passing through a dual gate FET as a function of bias applied to control gate $G_2$ for a fixed value of gate 1 bias ($V_{G1}$) and drain bias $V_D$. Thus by adjusting $V_{G2A}$ and $V_{G2B}$ not only is the gain of the respective FETs adjusted but also the phase of signal passed therethrough is affected. Similar plots also apply to $V_{G1}$ ($V_{G1A}$ and $V_{G1B}$) with $V_{G2}$ and $V_D$ fixed.

FIG. 5 to which attention is now directed is a vector diagram illustrating the effects of a particular bias setting of transistors 30 and 32 and best illustrates the operation of the predistortion circuit. The magnitude and direction of signal produced at the output of transistor 30 (FIG. 1) on line AA, for a particular value of input signal at terminal 20, is indicated by vector A in FIG. 5. Similarly, the magnitude and direction of the signal produced at the output of transistor 32 on line BB for the particular value of input at terminal 20, is indicated by vector B in FIG. 5. If the gate 2 bias on both of transistors 30 and 32 were identical, then because the signals input to gate 1 of transistor 30 and 32 are 90° apart vectors A and B would be in quadrature relation with one another but because the gate $G_2$ biases are purposely chosen to be dissimilar for purposes of affecting nonlinearity, vectors A and B are not in quadrature with one another, but rather are as illustrated in FIG. 5. Vector C in FIG. 5 represents the output at terminal 22 (FIG. 1) resulting from vector summation by in-phase combiner 40.

At a different, larger, value of input signal at terminal 20 than that which resulted in vectors A and B, a signal appears at the output of transistor 30, the direction and magnitude of which are indicated by dashed line A' in FIG. 5. Similarly, the output signal resulting from the larger input signal at transistor 32 resulting from the larger input signal at terminal 20 is represented by dashed line vector B' in FIG. 5. Vector C' is the result of the vector summation of the vectors A' and B' and is the signal appearing at terminal 22 for the given larger input signal. It will be noted that due to the different nonlinearities introduced into the two transistors 30 and 32, typically the change in phase angle between A and A' denoted $\phi_A$ in FIG. 5 is unequal to the change in phase between B and B' denoted as $\phi_B$ for any two different levels of input signal at terminal 20 (FIG. 1).

In FIG. 5, angle $\phi_C$ represents the phase change in the signal output at terminal 22 (FIG. 1) for the illustrated different input signals. Although not obvious from FIG. 5 the magnitude of the output signals represented by vectors C and C' does not typically bear a direct relationship with the different levels of input signal but rather is affected by the nonlinearity of the respective transistors 30 and 32 which, in turn, is a function bias values $V_{G1}$ and $V_{G2}$.

The particular bias voltages $V_{G1}$ and $V_{G2}$ for each dual-gate FET determines the nonlinearity produced by that dual-gate FET. The particular settings of $V_{G1A}$, $V_{G2A}$, $V_{G1B}$ and $V_{G2B}$ determine the overall nonlinearity produced by the predistortion circuit. The amount and phase of the nonlinearity produced by the predistortion circuit can be varied by varying the bias voltages on both gates of both FETs 30, 32. The bias voltage settings can be adjusted to produce different amplitude and phase nonlinearities which are inverse to that of the TWTA/SSPA 16. Thus, predistortion circuit 10 can be tuned for linearizing different TWTA/SSPAs. The particular value of $V_{G1A}$, $V_{G1B}$, $V_{G2A}$, $V_{G2B}$ are set empirically by simply observing the results at system output terminal 17 and varying the bias voltages until a linear output signal is obtained. For one particular 17 watt TWTA catalog number 1653 from Hughes Aircraft, Torrance, Calif., and dual gate FETs 30, 32 model number NE46385 manufactured by Nippon Electric Corp. (NEC), Kawasaki, Japan, the following bias voltages are used:

$V_{G1A} = -0.9$ volts
$V_{G1B} = -1.2$ volts
$V_{G2A} = -1.8$ volts
$V_{G2B} = -2.5$ volts
$V_D = 4$ volts With the above listed products and voltages a 5 to 10 DB reduction in 3rd IMD products of distortion at or near saturation was obtained.

Depending on the type of power amplifier 16 chosen, the amount of linearization required and the environment in which it and the predistortion circuit operates (controlled temperature vs. widely fluctuating temperatures) a dynammic adjustment of predistortion may be desirable or necessary. FIG. 6 illustrates one such system in which dynamic adjustment is present. The circuit of FIG. 6 is for the most part identical to the circuit of FIG. 1. The circuit is connected between a system input terminal 20 and a system output terminal 17. Input terminal 20 is connected to a 90° hybrid 24, the outputs of which are connected to dual gate FETs 30 and 32. The drain connections of the two transistors are connected to an in-phase combiner 40 which has its output terminal 22 connected to a linear amplifier 14 which in turn is coupled to a TWTA of SSPA 16, the output of which is coupled to system output terminal 17.

The amount of nonlinearity in FET transistors is, among other things, a function of the temperature of the transistor. The nonlinearity of each of transistors 30 and 32 is not solely a function of gate $G_2$ voltage but is also a function of the temperature of the transistors. This nonlinearity is particularly undesirable since typically a TWTA or SSPA is separately corrected for temperature variations. To compensate for the undesired nonlinearity, thermistors indicated by the circled letter T may be included in the drain bias circuit of each of the two transistors. By a proper choice of thermistor the drain bias can be made to substantially compensate for nonlinearity created by temperature.

In the circuit of FIG. 6 the gate $G_2$ bias of transistor 32 is not merely preset as in the circuit of FIG. 1 but rather is determined dynamically as a function of input voltage. Toward that end a coupler 60 is connected to a crystal detector 62 for detecting the RF signal applied at input terminal 20. The output of detector 62 is connected to a wideband amplifier 64. The output of the amplifier 64 is coupled to a resistive network comprising resistors 66 and 68 in the gate-to-bias circuit of transistor 32. A similar circuit could be connected to affect the gate $G_2$ bias of transistor 30. The operation of the circuit of FIG. 6 is similar to that of FIG. 1 and is illustrated in FIG. 5 except that, of course, the drain bias of each of transistors 30 and 32, is a function of the temperature of the transistors and therefore of thermistors T and the degree of nonlinearity in transistor 32 is not fixed as in FIG. 1 but rather is a function of the value of signal input at terminal 20 which signal is converted to a voltage by the combination of crystal detector 62 and amplifier 64.

What is claimed is:

1. A predistortion circuit for predistorting a signal applied to a following power amplifier exhibiting phase and amplitude nonlinearities as a function of input power, said circuit comprising in combination:
    an input terminal coupled to receive a signal to be amplified and an output terminal coupled to the input of said power amplifier;
    means for power dividing a signal applied to the circuit input terminal and for providing a 90° phase shift of one divided signal relative to the other;
    first and second active nonlinear means each adapted for receiving an input signal from a different one of the outputs of said power divider and each adapted for producing an output signal; and
    means coupled to receive the output signals from the nonlinear means for combining in phase the signals produced by the active nonlinear means;
    said active nonlinear means each adapted for receiving a bias voltage for controlling the amount of distortion produced by the predistortion circuit whereby the predistortion circuit predistorts the signal in a manner complementary to the distortion produced by the following power amplifier.

2. A predistortion circuit for predistorting a signal applied to a following power amplifier exhibiting phase and amplitude nonlinearities as a function of input power, said circuit comprising in combination:
    an input terminal coupled to receive a signal to be amplified and an output terminal coupled to the input of said power amplifier;
    means for power dividing a signal applied to the circuit input terminal and for providing a 90° phase shift of one divided signal relative to the other;
    first and second dual gate field effect transistors, each having a signal output terminal, a control gate and a signal gate, said signal gate coupled to a different one of the outputs of said power dividing means; and
    means coupled between the dual gate FET signal output terminals and circuit output terminal for combining in phase the signal produced by said dual gate FETs,
    each said control gate adapted for receiving a bias voltage for controlling the amount of phase and amplitude distortion produced by the predistortion circuit whereby the predistortion circuit predistorts the signal in a manner complementary to the distortion produced by the following power amplifier.

3. The combination as set forth in claim 2 wherein said means for power dividing is a 90° hybrid.

4. The combination as set forth in claim 2 further including means for applying a bias voltage to each said control gate.

5. The combination as set forth in claim 4 wherein said means for applying a bias voltage applies a different bias voltage to each said control gate.

6. The combination as set forth in claim 4 further including means for applying a bias voltage to each said signal gate.

7. The combination as set forth in claim 6 wherein said means for applying a bias voltage applies a different bias voltage to each said signal gate.

8. The combination as set forth in claim 2 further including means for applying a bias voltage to the control gate of at least one of said FETs which is a function of a changeable parameter.

9. The combination as set forth in claim 2 further including means for applying a bias voltage to the control gate of at least one of said FETs which is a function of input power.

10. The combination as set forth in claim 2 wherein each of said FETs includes source and drain terminals and wherein said predistortion circuit further comprises bias means coupled between said drain and source terminals, the voltage of said bias being a function of a changeable parameter.

11. The combination as set forth in claim 2 wherein each of said FETs includes source and drain terminals and wherein said predistortion circuit further comprises bias means coupled between said drain and source terminals, the voltage of said bias being a function of the temperature of said predistortion circuit.

* * * * *